United States Patent
Bae et al.

(10) Patent No.: US 11,264,166 B2
(45) Date of Patent: Mar. 1, 2022

(54) INTERPOSER AND ELECTRONIC COMPONENT INCLUDING THE SAME

(71) Applicant: SAMSUNG ELECTRO-MECHANICS CO., LTD., Suwon-si (KR)

(72) Inventors: Su Rim Bae, Suwon-si (KR); Jong Pil Lee, Suwon-si (KR); Hae In Kim, Suwon-si (KR); Eun Ju Oh, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 147 days.

(21) Appl. No.: 16/593,692

(22) Filed: Oct. 4, 2019

(65) Prior Publication Data
US 2020/0343044 A1    Oct. 29, 2020

(30) Foreign Application Priority Data

Apr. 26, 2019  (KR) .................. 10-2019-0048884

(51) Int. Cl.
*H01G 2/06*    (2006.01)
*H01G 4/005*    (2006.01)
(Continued)

(52) U.S. Cl.
CPC ............. *H01G 2/065* (2013.01); *H01G 4/005* (2013.01); *H01G 4/12* (2013.01); *H01G 4/228* (2013.01);
(Continued)

(58) Field of Classification Search
CPC .......... H01G 2/065; H01G 4/005; H01G 4/12; H01G 4/228; H01G 4/30; H01G 2/06;
(Continued)

(56) References Cited

U.S. PATENT DOCUMENTS

| | | | |
|---|---|---|---|
| 10,062,511 B1 | 8/2018 | Park et al. | |
| 2009/0065921 A1* | 3/2009 | Yamazaki | H01L 23/4985 257/686 |

(Continued)

FOREIGN PATENT DOCUMENTS

| | | |
|---|---|---|
| CN | 104900405 A | 9/2015 |
| CN | 109036845 A | 2/2018 |

(Continued)

OTHER PUBLICATIONS

Chinese Office Action dated Jun. 30, 2021 issued in Chinese Patent Application No. 201911266650.X (with English translation).

*Primary Examiner* — Michael P McFadden
(74) *Attorney, Agent, or Firm* — Morgan, Lewis & Bockius LLP

(57) ABSTRACT

An interposer includes an interposer body; first and second lower patterns spaced apart from each other on a lower surface of the interposer body; and first and second upper patterns spaced apart from each other on an upper surface of the interposer body. The first and second upper patterns include first and second shape-securing layers spaced apart from each other on the upper surface of the interposer body, and first and second acoustic noise reduction layers disposed on the first and second shape-securing layers, respectively. An electronic component includes a capacitor and the interposer.

19 Claims, 10 Drawing Sheets

(51) Int. Cl.
    *H01G 4/12*      (2006.01)
    *H01G 4/228*     (2006.01)
    *H01G 4/30*      (2006.01)
    *H05K 1/14*      (2006.01)
    *H05K 1/18*      (2006.01)

(52) U.S. Cl.
    CPC ............... *H01G 4/30* (2013.01); *H05K 1/141* (2013.01); *H05K 1/181* (2013.01); *H05K 2201/049* (2013.01); *H05K 2201/10015* (2013.01); *H05K 2201/10378* (2013.01); *H05K 2201/2045* (2013.01)

(58) Field of Classification Search
    CPC .......... H01G 4/012; H01G 4/38; H01G 4/232; H01G 4/40; H05K 1/141; H05K 1/181; H05K 2201/10015; H05K 2201/10378; H05K 2201/2045; H05K 2201/049
    See application file for complete search history.

(56) References Cited

U.S. PATENT DOCUMENTS

| | | |
|---|---|---|
| 2013/0319741 A1 | 12/2013 | Ahn et al. |
| 2015/0122534 A1 | 5/2015 | Park et al. |
| 2015/0255213 A1 | 9/2015 | Lee et al. |
| 2016/0007446 A1* | 1/2016 | Ishikawa .................. H01G 4/30 |
| | | 174/260 |
| 2016/0205769 A1* | 7/2016 | Park ..................... H05K 1/0271 |
| | | 174/260 |
| 2017/0280564 A1* | 9/2017 | Nishimura ............. H05K 1/113 |

FOREIGN PATENT DOCUMENTS

| | | |
|---|---|---|
| KR | 10-1309479 B1 | 9/2013 |
| KR | 10-2015-0051668 A | 5/2015 |
| KR | 10-2015-0089277 A | 8/2015 |

\* cited by examiner

INTERPOSER AND ELECTRONIC COMPONENT INCLUDING THE SAME

CROSS-REFERENCE TO RELATED APPLICATION(S)

This application claims benefit of priority to Korean Patent Application No. 10-2019-0048884 filed on Apr. 26, 2019 in the Korean Intellectual Property Office, the disclosure of which is incorporated herein by reference in its entirety.

TECHNICAL FIELD

The present disclosure relates to an interposer and an electronic component including the same.

BACKGROUND

A multilayer capacitor has a small size, may realize high-capacitance, and is used as an element in various electronic devices.

Such a multilayer capacitor has a structure in which a plurality of dielectric layers and internal electrodes having different polarities are alternately disposed between the dielectric layers.

In this case, since the dielectric layer has piezoelectricity and electrostrictivity, when a DC or AC is applied to the multilayer capacitor, a piezoelectric phenomenon occurs between the internal electrodes, which may cause periodic vibrations while expanding and contracting a volume of a capacitor body depending on a frequency.

Such vibrations may be transmitted to a substrate through a solder, connecting an external electrode of the multilayer capacitor and the substrate during mounting of the substrate, such that an entire substrate may act as an acoustic reflection surface to generate a vibration sound, which becomes noise.

Such a vibration sound may correspond to an audible frequency in a 20 to 20,000 Hz band, which may cause listener discomfort. The vibration sound which may cause listener discomfort is referred to as acoustic noise.

Meanwhile, as a method for reducing such acoustic noise, an electronic component using an interposer disposed between the multilayer capacitor and the substrate may be provided.

However, in the case of an electronic component using an interposer in the related art, an electrode pattern formed on the interposer body may not be formed as designed, resulting in a problem of the generation of defects during a surface mounting operation.

For example, in the surface mounting operation in which an interposer is disposed on a multilayer capacitor, defects such as chip tombstone defects, in which the interposer is tilted to one side due to a defective electrode pattern or a chip distortion phenomenon in which a portion of the interposer protrudes outwardly of the multilayer capacitor may occur.

Thus, a technique for preventing surface mounting defects while effectively reducing the acoustic noise of the multilayer capacitor is required.

SUMMARY

An aspect of the present disclosure is to provide an interposer capable of preventing various defects that may occur during a surface mounting operation while reducing an acoustic noise reduction effect, and an electronic component including the interposer.

According to an aspect of the present disclosure, an interposer includes an interposer body; first and second lower conductive patterns spaced apart from each other on a lower surface of the interposer body; and first and second upper conductive patterns spaced apart from each other on an upper surface of the interposer body. The first and second upper conductive patterns comprise first and second conductive layers spaced apart from each other on the upper surface of the interposer body, and third and fourth conductive layers disposed on the first and second conductive layers, respectively.

In an embodiment of the present disclosure, thicknesses of the first and second lower conductive patterns may be 10 µm or less, respectively.

In an embodiment of the present disclosure, the first and second conductive layers may have thicknesses of 10 µm or less, respectively, and the third and fourth conductive layers may have thicknesses of 20 µm or less, respectively.

In an embodiment of the present disclosure, areas of the third and fourth conductive layers may be smaller than areas of the first and second conductive layers, respectively.

In an embodiment of the present disclosure, an area ratio of the area of the third conductive layer compared to the area of the first conductive layer or an area ratio of the area of the fourth conductive layer compared to the area of the second conductive layer may not exceed 81.43%.

In an embodiment of the present disclosure, the interposer may further include a marking portion disposed between the first and second upper conductive patterns on the upper surface of the interposer body.

In an embodiment of the present disclosure, the interposer may further include a plating layer on surfaces of the first and second external terminals.

In an embodiment of the present disclosure, a length of each of the first and second upper conductive patterns in a longitudinal direction of the interposer may be 0.450 to 0.600 mm.

In an embodiment of the present disclosure, the interposer may further include: a first conductive via penetrating the interposer body, and connecting the first lower conductive pattern and the first upper conductive pattern to each other; and a second conductive via penetrating the interposer body, and connecting the second lower conductive pattern and the second upper conductive pattern to each other.

In an embodiment of the present disclosure, the first upper conductive pattern may be thicker than the first lower conductive pattern, and the second upper conductive pattern may be thicker than the second lower conductive pattern.

In an embodiment of the present disclosure, the first and second conductive layers may be shape-securing layers, respectively, and the third and fourth conductive layers may be acoustic noise reduction layers, respectively.

According to an aspect of the present disclosure, an electronic component includes: a multilayer capacitor including a capacitor body and first and second external electrodes respectively disposed on both ends of the capacitor body; and an interposer including an interposer body and first and second external terminals respectively disposed on both ends of the interposer body. The first and second external terminals of the interposer comprise: first and second lower conductive patterns spaced apart from each other on a lower surface of the interposer body; and first and second upper conductive patterns spaced apart from each other on an upper surface of the interposer body, and connected to the first and second external electrodes, respectively. The first and second upper conductive patterns comprise first and second conductive layers spaced apart from each other on the upper surface of the interposer body, and third and fourth conductive layers disposed on the first and second conductive layers, respectively.

In an embodiment of the present disclosure, thicknesses of the first and second lower conductive patterns of the interposer may be 10 μm or less, respectively.

In an embodiment of the present disclosure, the first and second conductive layers may have thicknesses of 10 μm or less, respectively, and the third and fourth conductive layers may have thicknesses of 20 μm or less, respectively.

In an embodiment of the present disclosure, areas of the third and fourth conductive layers may be smaller than areas of the first and second conductive layers, respectively.

In an embodiment of the present disclosure, an area ratio of the area of the third conductive layer compared to the area of the first conductive layer or an area ratio of the area of the fourth conductive layer compared to the area of the second conductive layer may not exceed 81.42%.

In an embodiment of the present disclosure, the electronic component may further include a marking portion disposed between the first and second upper conductive patterns on the upper surface of the interposer body.

In an embodiment of the present disclosure, the capacitor body of the multilayer capacitor may have first and second surfaces opposing each other, third and fourth surfaces connected to the first and second surfaces and opposing each other, and fifth and sixth surfaces connected to the first and second surfaces and the third and fourth surfaces and opposing each other, comprises a plurality of dielectric layers and a plurality of first and second internal electrodes disposed alternately with the dielectric layers interposed therebetween. One ends of the first and second internal electrodes may be exposed through the third and fourth surfaces, respectively, and connected to first and second external electrodes, respectively.

In an embodiment of the present disclosure, the first and second external electrodes may include first and second head portions disposed on the third and fourth surfaces of the capacitor body, respectively; and first and second band portions extending from the first and second head portions to a portion of the first surface of the capacitor body.

In an embodiment of the present disclosure, the first and second conductive layers may be shape-securing layers, respectively, and the third and fourth conductive layers may be acoustic noise reduction layers, respectively.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
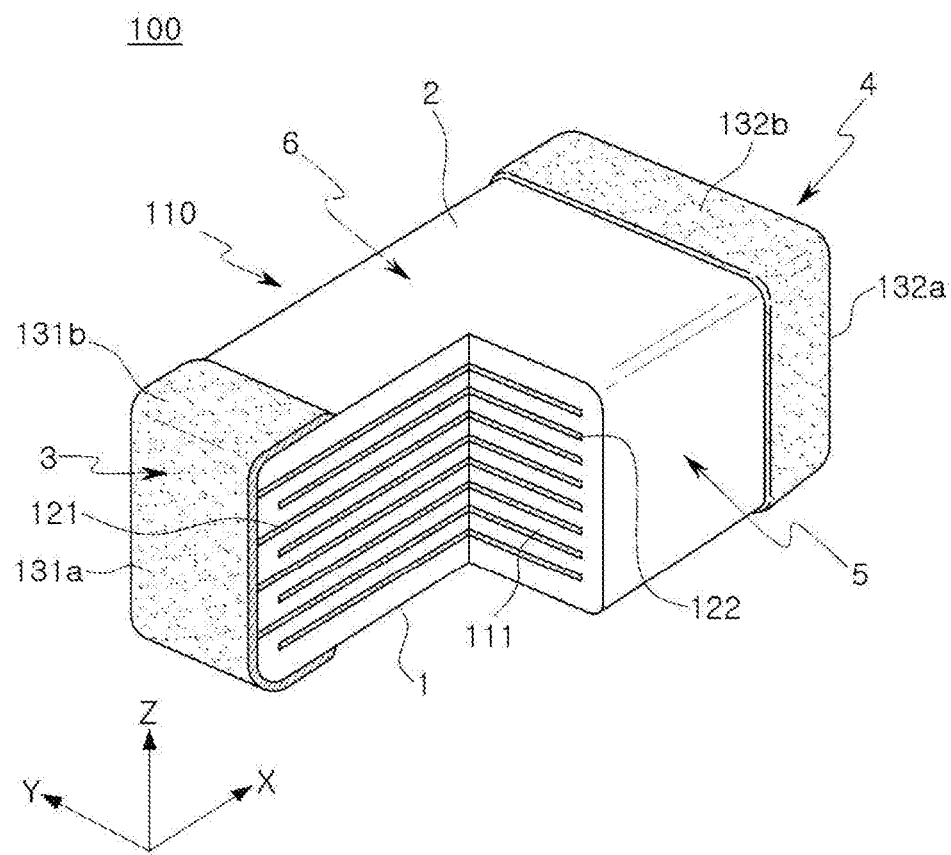
FIG. 1 is a perspective view partially illustrating a multilayer capacitor applied to an electronic component of the present disclosure.

Hereinafter, exemplary embodiments of the present disclosure will be described in detail with reference to the accompanying drawings.

The present disclosure may, however, be exemplified in many different forms and should not be construed as being limited to the specific embodiments set forth herein.

Rather, these embodiments are provided so that this disclosure will be thorough and complete, and will fully convey the scope of the disclosure to those skilled in the art.

In the drawings, the shapes and dimensions of elements may be exaggerated for clarity. Further, in the drawings, elements having the same functions within the same scope of the inventive concept will be designated by the same reference numerals.

In addition, the same reference numerals are used throughout the drawings for portions having similar functions and operations.

Throughout the specification, when a component is referred to as "comprise" or "comprising," it means that it may include other components as well, rather than excluding other components, unless specifically stated otherwise.

When a direction is defined to clearly explain an embodiment of the present disclosure, X, Y, and Z shown in figures represent a length direction, a width direction, and a thickness direction of the multilayer capacitor and the interposer, respectively.

Here, the z direction may be conceptually the same as a lamination direction in which dielectric layers are laminated.

Figure 2:
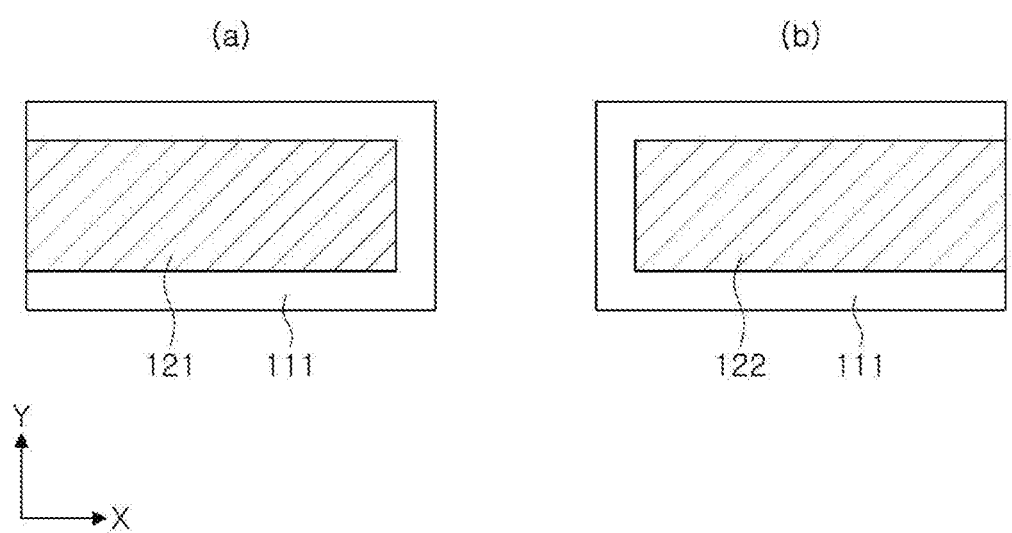
FIG. 2 shows plan views illustrating first and second internal electrodes of the multilayer capacitor of FIG. 1, respectively.

FIG. 1 is a perspective view partially illustrating a multilayer capacitor applied to an electronic component in the present disclosure, and FIG. 2 shows plan views illustrating first and second internal electrodes of the multilayer capacitor of FIG. 1.

First, a structure of a multilayer capacitor 100 applied to the electronic component of the present embodiment will be described with reference to FIGS. 1 and 2.

The multilayer capacitor 100 of the present embodiment may include a capacitor body 110 and first and second external electrodes 131 and 132 (131 and 132 shown in FIG. 3) formed on both ends of the capacitor body 110 in an x direction.

The capacitor body 110 is formed by laminating a plurality of dielectric layers 111 in the Z direction and then sintering the plurality of dielectric layers 111, and boundaries between the dielectric layers 111 adjacent to each other may be integrated, such that they may be difficult to confirm without using a scanning electron microscope (SEM).

In addition, the capacitor body 110 may include the plurality of dielectric layers 111 and the first and second internal electrodes 121 and 122 having different polarities from each other, alternately disposed in the Z direction with the dielectric layers 111 interposed therebetween.

In addition, the capacitor body 110 may include an active region serving as a part contributing to capacitance formation of the capacitor and a cover region provided on both side portions of the capacitor body in the y direction and on upper and lower or portions of the active region in the z direction respectively, as margin portions.

Although the shape of the capacitor body 110 is not particularly limited, it may be a hexahedron shape. The capacitor body 110 may have first and second surfaces 1 and 2 opposing each other in the z direction, third and fourth surfaces 3 and 4 connected to the first and second surfaces 1 and opposing each other in the x direction, and fifth and sixth surfaces 5 and 6 connected to the first and second surfaces 1 and 2 and the third and fourth surfaces 3 and 4, and opposing each other.

The dielectric layer 111 may include a ceramic powder, for example, a $BaTiO_3$-based powder, or the like.

The $BaTiO_3$-based ceramic powder may be, for example, $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like is partially dissolved in $BaTiO_3$, and the present disclosure is not limited thereto.

In addition, a ceramic additive, an organic solvent, a plasticizer, a binder, a dispersant, and the like, may further be added to the dielectric layer 111, together with the ceramic powder.

The ceramic additive, may be, for example, a transition metal oxide or a transition metal carbide, a rare earth element, magnesium (Mg), aluminum (Al), or the like.

The first and second internal electrodes 121 and 122 are electrodes to which different polarities are applied, and may be formed on the dielectric layer 111 and laminated in the Z direction. The first and second internal electrodes 121 and 122 may be alternately disposed to oppose each other with the dielectric layer 111 interposed therebetween in the Z direction.

In this case, the first and second internal electrodes 121 and 122 may be electrically insulated from each other by the dielectric layer 111 disposed between the first and second internal electrodes 121 and 122.

Meanwhile, in the present disclosure, a structure in which the internal electrodes are laminated in the Z direction has been described, but the present disclosure is not limited thereto, and a structure in which the internal electrodes are laminated in the Y direction, may also be applied thereto, if necessary.

One ends of the first and second internal electrodes 121 and 122 may be exposed through the third and fourth surfaces 3 and 4 of the capacitor body 110, respectively.

The end portions of the first and second internal electrodes 121 and 122 alternately exposed through the third and fourth surfaces 3 and 4 of the capacitor body 110 may be respectively connected to first and second external electrodes 131 and 132 disposed on both end portions of the capacitor body 110 in the X direction to be described later and may be electrically connected.

According to the above-described configuration, when a predetermined voltage is applied to the first and second external electrodes 131 and 132, charges are accumulated between the first and second internal electrodes 121 and 122.

In this case, capacitance of the multilayer capacitor 100 is proportional to an overlapped region of the internal electrodes 121 and 122 superimposed each other in the Z direction in the active region.

In addition, a material for forming the first and second internal electrodes 121 and 122 is not particularly limited, and may be formed by using a noble metal material, for example, platinum (Pt), palladium (Pd), an alloy of palladium-silver (Pd—Ag), and the like, and a conductive paste formed of at least one of nickel (Ni) and copper (Cu).

In this case, the conductive paste may be printed by using a screen printing method, a gravure printing method, or the like, but the present disclosure is not limited thereto.

The first and second external electrodes 131 and 132 are provided with voltages having different polarities, may be formed on both end portions of the capacitor body 110 in the X direction, and may respectively be connected to the exposed end portions of the first and second internal electrodes 121 and 122.

The first external electrode 131 may include a first head portion 131a and a first band portion 131b.

The first head portion 131a may be disposed on the third surface 3 of the capacitor body 110, may be in contact with the end portion of the first internal electrode 121 exposed externally through the third surface 3 of the capacitor body 110, and serve to electrically connect the first internal electrode 121 and the first external electrode 131 to each other.

The first band portion 131b may be a portion extending from the first head portion 131a to portions of the first, second, fifth, and sixth surfaces 1, 2, 5, and 6, of the capacitor body 110 for improving adhesion strength, or the like.

The second external electrode 132 may include a second head portion 132a and a second band portion 132b.

The second head portion 132a may be disposed on the fourth surface 4 of the capacitor body 110, may be in contact with the end portion of the second internal electrode 122 exposed externally through the fourth surface 4 of the capacitor body 110, and serve to electrically connect the second internal electrode 122 and the second external electrode 132 to each other.

The second band portion 132b may be a portion extending from the second head portion 132a to portions of the first, second, fifth, and sixth 1, 2, 5, and 6 of the capacitor body 110 to improve adhesion strength, or the like.

Meanwhile, the first and second external electrodes 131 and 132 may further include a plating layer.

The plating layer may include first and second nickel (Ni) plating layers and first and second tin (Sn) plating layers, covering the first and second nickel plating layers, respectively.

Figure 3:
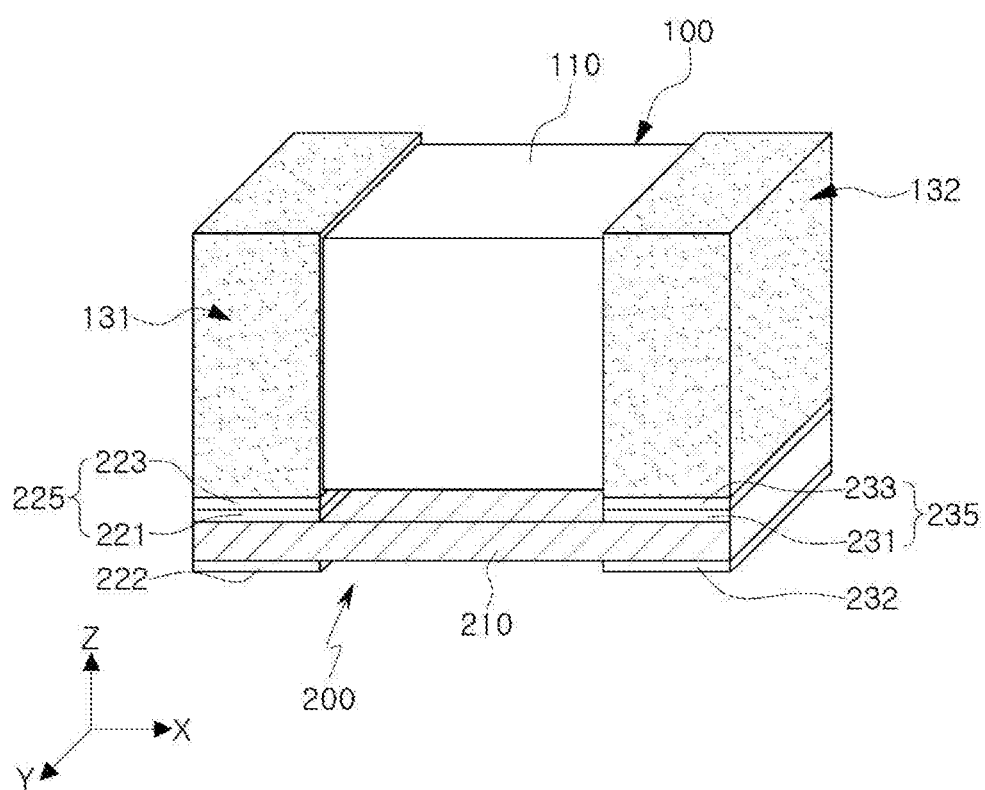
FIG. 3 is a perspective view of an electronic component according to an embodiment of the present disclosure.
Figure 4:
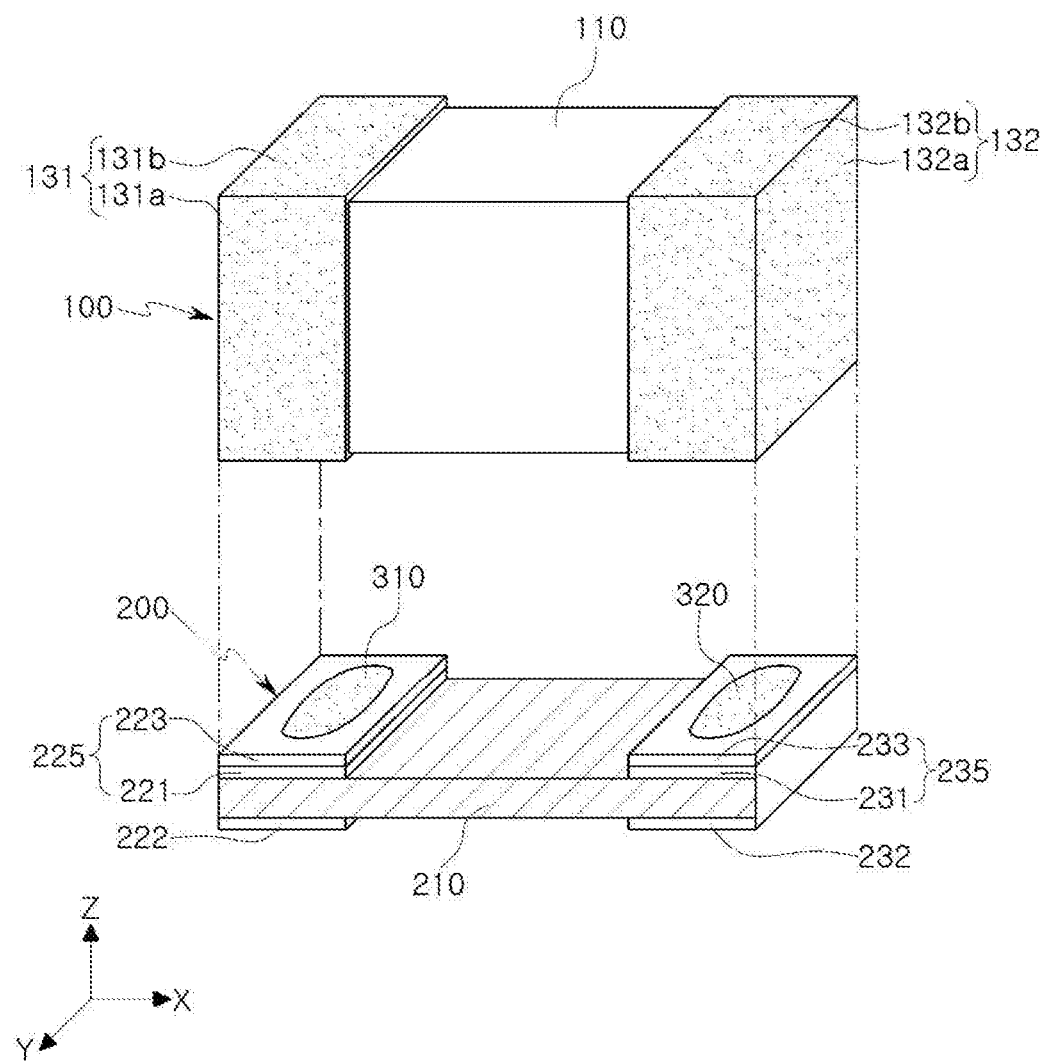
FIG. 4 is an exploded perspective view of FIG. 3.
Figure 5:
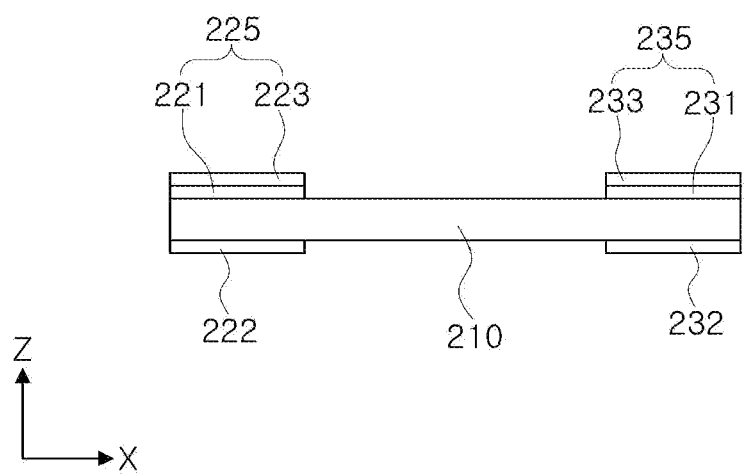
FIG. 5 is a front view of the interposer in FIG. 3.
Figure 6:
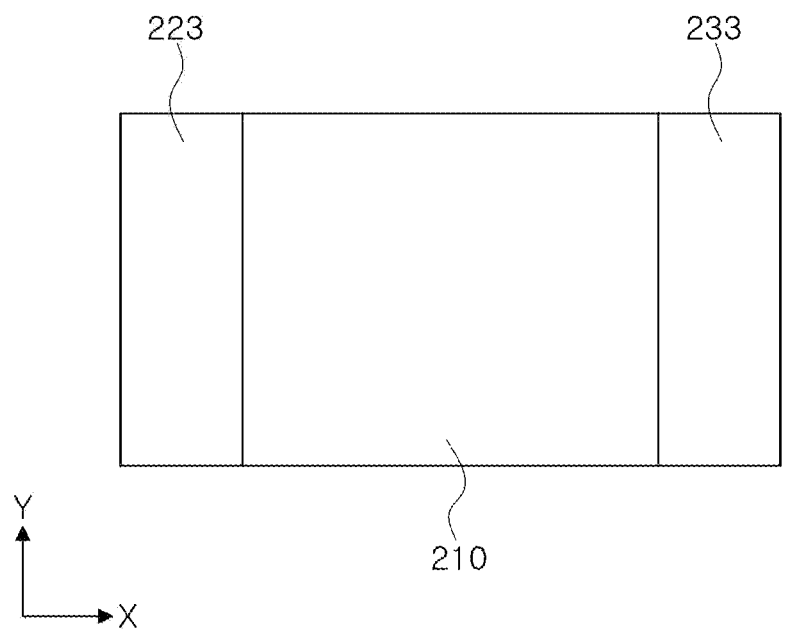
FIG. 6 is a plan view of the interposer in FIG. 3.
Figure 7:
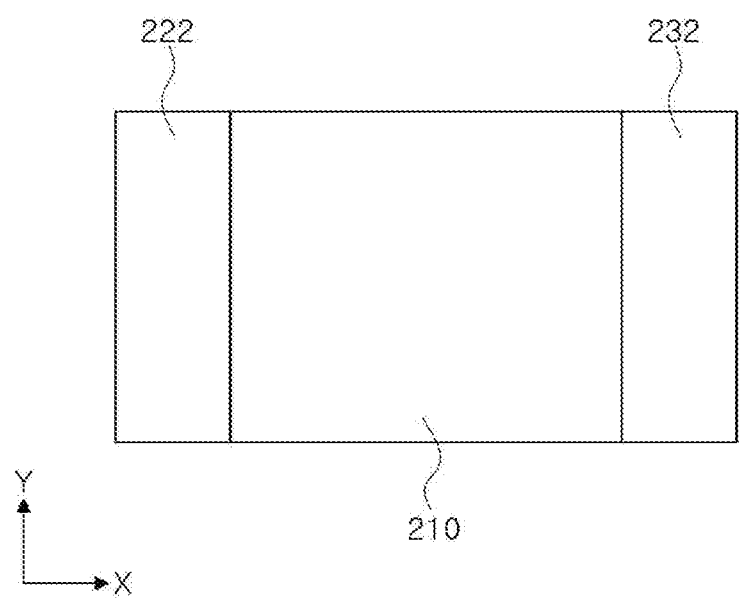
FIG. 7 is a front view of the interposer in FIG. 3.
Figure 8:
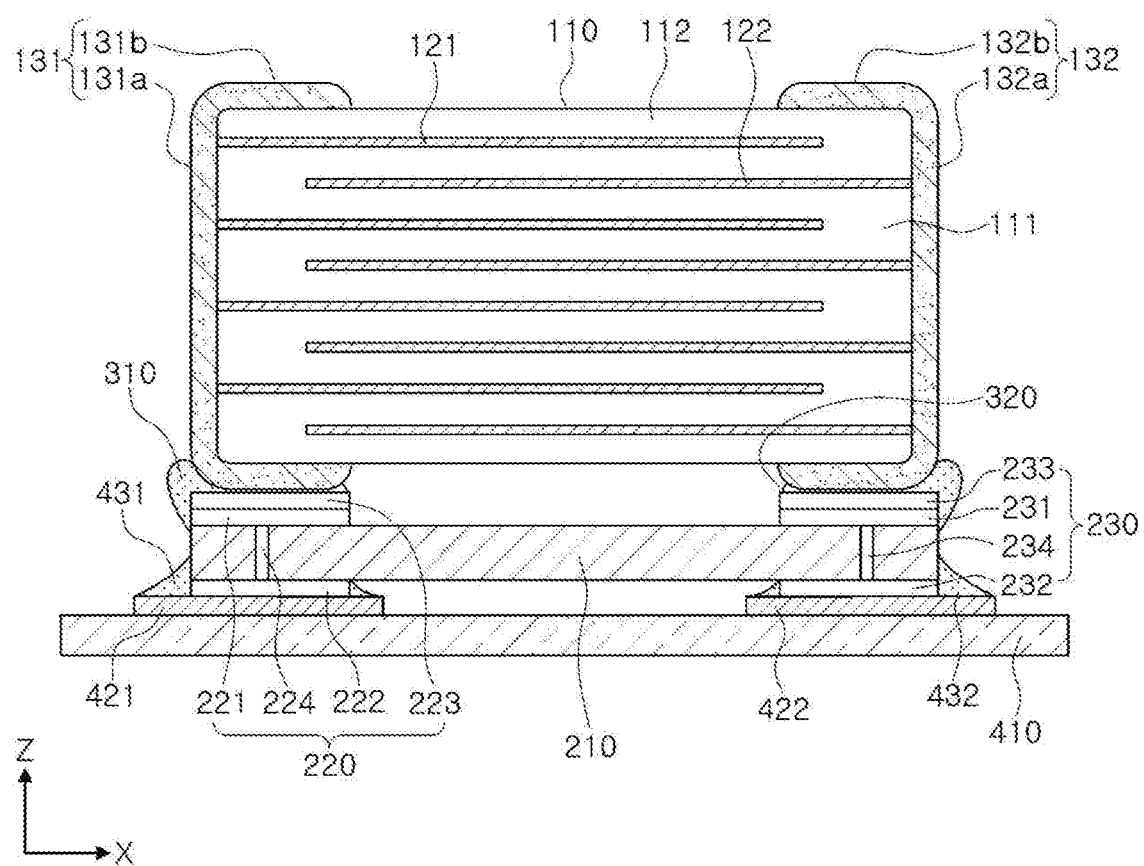
FIG. 8 is a cross-sectional view illustrating a state in which the electronic component of FIG. 3 is mounted on a substrate.

FIG. 3 is a perspective view of an electronic component according to an embodiment of the present disclosure, FIG. 4 is an exploded perspective view of FIG. 3, FIG. 5 is a front view of the interposer of FIG. 3, FIG. 6 is a plan view of the interposer in FIG. 3, FIG. 7 is a front view of the interposer in FIG. 3, and FIG. 8 is a cross-sectional view illustrating a state in which the electronic component of FIG. 3 is mounted on a substrate.

Referring to FIGS. 3 to 7, an electronic component 101 according to the present embodiment includes a multilayer capacitor 100 and an interposer 200.

The interposer 200 includes an interposer body 210 and first and second external terminals 220 and 230 formed on both end portions of the interposer body 210 in an X direction, respectively.

The interposer body 210 may be made of a ceramic material, preferably, made of alumina ($Al_2O_3$).

The first and second external terminals 220 and 230 may be provided with voltages of different polarities, and may be respectively connected to the first and second band portions 131b and 132b of the first and second external electrodes 131 and 132 and may be electrically connected.

The first external terminal 220 may include a first lower pattern 222 and a first upper pattern 225.

The first lower pattern 222 may be disposed on the lower surface of the interposer body 210 to serve as a terminal when mounted on the substrate.

In this case, the first lower pattern 222 may be one cross-section of the interposer body 210 in the X direction and may be exposed through one cross-section and both side surfaces of the interposer body 210.

In addition, a thickness of the first lower pattern 222 may be 10 μm or less so as to have symmetry and form an accurate shape as designed.

If the thickness of the first lower pattern 222 exceeds 10 μm, a problem in which the first lower pattern 222 is not symmetrical or the shape as designed is not appropriately realized may occur.

Specifically, if the symmetry of the first lower pattern 222 is not good or the accurate shape as designed is not formed, defects of the electrode shapes of the interposer may occur. As a result, when a plating process of the interposer itself, an additional plating process after the capacitor is bonded, and the like, proceeds, short defects or IR defects may occur due to electrode smearing.

In addition, defects such as a chip tombstone defect in which the interposer is tilted to one side or a chip deformation phenomenon in which a portion of the interposer protrudes to the outside of the multilayer capacitor may occur during a surface mounting operation in which the interposer is disposed on the multilayer capacitor.

Therefore, according to the present disclosure, it is possible to secure the shape of the first lower pattern and to reduce the defects that occur during the surface mounting operation of the interposer.

The first upper pattern 225 is a portion in which the first band portion 131b of the first external electrode 131 of the multilayer capacitor 100 is bonded, and may be disposed so as to face the first lower pattern 222 in a Z direction. The first upper pattern 225 may include a first shape-securing layer 221 and a first acoustic noise reduction layer 223.

The first shape-securing layer 221 may be disposed on the upper surface of the interposer body 210, and may be formed to be thin such that the shape and area of the first upper pattern 225 may be formed as designed so as to ensure the symmetry of the surface mounting.

Therefore, according to the present disclosure, it is possible to reduce the defects that occur during the surface mounting operation of the interposer as in the first lower pattern by the first shape-securing layer.

In this case, the first shape-securing layer 221 may be disposed to be exposed through one cross-section and both side surfaces of the interposer body 210.

The first acoustic noise reduction layer 223 is a portion disposed on the upper surface of the first shape-securing layer 221 and connected to the first band portion 131b, and may serve as a bumper for reducing vibrations transmitted from the multilayer capacitor 100.

In this case, a conductive bonding agent 310 may be disposed between the first acoustic noise reduction layer 223 and the first band portion 131b to bond the first external terminal 220 and the first external electrode 131 to each other.

The conductive bonding agent 310 may be made of a solder having a high melting point, or the like.

The first external terminal 220 may have a first via 224 (shown in FIG. 8) penetrating the interposer body 210 in the Z direction such that an upper end and a lower end thereof are exposed.

The upper end of the first via 224, exposed to the upper surface of the interposer body 210 may be connected to the first shape-securing layer 221, and the lower end of the first via 224, exposed to the lower surface of the interposer body 210 may be connected to the first lower pattern 222.

The first via 224 may physically and electrically connect the first lower pattern 222 and the first upper pattern 225.

The second external terminal 230 may include a second lower pattern 232 and a second upper pattern 235.

The second lower pattern 232 may be spaced apart from the first lower pattern 222 in the X direction on the lower surface of the interposer body 210 to serve as a terminal when mounted on the substrate.

In this case, the second lower pattern 232 may be disposed on the other cross-section of the interposer body 210 in the X direction, and may be disposed to be exposed through the other cross-section and both side surfaces of the interposer body 210.

In addition, a thickness of the second lower pattern 232 may be 10 μm or less so as to have symmetry and form an accurate shape as designed.

If the thickness of the second lower pattern 232 exceeds 10 μm, a problem in which the second lower pattern 232 is not symmetrical or the shape as designed is not appropriately realized may occur.

Specifically, if the symmetry of the second lower pattern 232 is not good or the accurate shape as designed is not formed, defects of the electrode shapes of the interposer may occur. As a result, when a plating process of the interposer itself or an additional plating process after the capacitor is bonded, and the like, proceed, short defects or IR defects may occur due to electrode smearing may occur.

In addition, defects such as a chip tombstone defect in which the interposer is tilted to one side or a chip deformation phenomenon in which a portion of the interposer protrudes to the outside of the multilayer capacitor may occur during a surface mounting operation in which the interposer is disposed on the multilayer capacitor.

Therefore, according to the present disclosure, it is possible to secure the shape of the second lower pattern and to reduce the defects that occur during the surface mounting operation of the interposer.

The second upper pattern 235 is a portion in which the second band portion 132b of the second external electrode 132 of the multilayer capacitor 100 is bonded, may be disposed so as to face the second lower pattern 232 in the Z direction, and may include the second shape-securing layer 231 and the second acoustic noise reduction layer 233.

The second shape-securing layer 231 may be disposed on the upper surface of the interposer body 210 to be spaced apart from the first shape-securing layer 221 in the X direction, and may be formed to be thin such that the shape and area capable of securing the symmetry of the surface mounting may be formed as designed.

Therefore, according to the present disclosure, it is possible to reduce the align miss and error that occur during the surface mounting operation of the interposer as in the second lower pattern by the second shape-securing layer.

In this case, the second shape-securing layer 231 may be disposed to be exposed through the other cross-section and both side surfaces of the interposer body 210.

The second acoustic noise reduction layer 233 is a portion disposed on the upper surface of the second shape-securing layer 231 and connected to the second band portion 132b, and may serve as a bumper for reducing vibrations transmitted from the multilayer capacitor 100.

In this case, a conductive bonding agent 320 may be disposed between the second acoustic noise reduction layer 233 and the second band portion 132b to bond the second external terminal 230 and the second external electrode 132 to each other.

The conductive bonding agent 320 may be made of a solder having a high melting point, or the like.

The second external terminal 230 may have a second via 234 (shown in FIG. 8) penetrating the interposer body 210 in the Z direction such that an upper end and a lower end thereof are exposed.

The upper end of the second via 234, exposed to the upper surface of the interposer body 210 may be connected to the second shape-securing layer 231, and the lower end of the second via 234, exposed to the lower surface of the interposer body 210 may be connected to the second lower pattern 232.

The second via 234 may physically and electrically connect the second lower pattern 232 and the second upper pattern 235.

In this case, in the first and second upper patterns 225 and 235, the thicknesses of the first and second shape-securing layers 221 and 231 may be 10 µm or less, respectively, and in the first and second upper patters, the thicknesses of the first and second acoustic noise reduction layers 223 and 233 may be 5 µm or less, respectively.

That is, a conductive paste is printed once on the upper surface of the interposer body 210 to be spaced apart from each other in the X direction such that the thickness thereof is 10 µm or less, respectively, thereby forming the first and second shape-securing layers 221 and 231 having a uniform shape, and in order to further increase the thicknesses of the first and second upper patterns 225 and 235 on the upper surface of the interposer body 210, a conductive paste is additionally printed on the first and second shape-securing layers 221 and 231 such that the thickness thereof is 20 µm or less, respectively, thereby forming the first and second acoustic noise reduction layers 223 and 233 having a thickness of 20 µm or less, respectively. In one example, the conductive paste used to form first and second shape-securing layers 221 and 231 and the conductive paste used to form the first and second acoustic noise reduction layers 223 and 233 may be the same. In another example, the conductive paste used to form first and second shape-securing layers 221 and 231 and the conductive paste used to form the first and second acoustic noise reduction layers 223 and 233 may be different. Since the first shape-securing layer 221 and the first acoustic noise reduction layer 223 are made by two different printing processes and the second shape-securing layer 231 and the second acoustic noise reduction layer 233 are made by two different printing processes, a boundary or an interface between the first shape-securing layer 221 and the first acoustic noise reduction layer 223 and a boundary or an interface between the second shape-securing layer 231 and the second acoustic noise reduction layer 233 may exist, even if the same conductive paste is used to form the first and second acoustic noise reduction layers 223 and 233 and the first and second shape-securing layers 221 and 231.

In this case, if the thicknesses of the first and second shape-securing layers 221 and 231 exceed 10 µm, a problem in which the shapes and areas of the first and second shape-securing layers 221 and 231 are not formed as designed, and the thickness variations of the first and second upper patterns 225 and 235 occurs or the surfaces thereof are not flat may occur, and if the thicknesses of the first and second acoustic noise reduction layers 223 and 233 exceed exceeds 20 µm, a problem in which the acoustic noise reduction effect is deteriorated may occur.

Meanwhile, in order to form the interposer, a split slit is first formed on a ceramic substrate by a laser scribing method, then an electrode pattern is printed and sintered, and then a plating layer is formed for adhesion to a PCB substrate after dividing the split slit into chip sizes.

Next, the interposer applies a dry film photoresist (DFR) on a via hole processed ceramic substrate and forms an electrode pattern through an exposure light, and then applies a seed metal such as nickel-chromium, and the like by a sputtering method.

Thereafter, the DFR is removed, and the resultant thereof is divided into chips by dicing to form a plating layer.

Next, the printing method and the photoresist method are combined, and a strippable paste is applied to the photoresist method and an external terminal is generated by metal sputtering on the exposed surface after the paste is printed, and then the strippable paste is removed. Thus, it is possible to make a chip shape having various structures while having a fast process lead time and being advantageous in mass production.

Referring to FIG. 8, when a voltage having different polarities is applied to the first and second external electrodes 131 and 132 formed on the electronic component 101 in a state in which the electronic component 101 is mounted on the substrate 410, the capacitor body 110 expands and contracts in the Z direction by an inverse piezoelectric effect of the dielectric layer 111.

Thus, both end portions of the first and second external electrodes 131 and 132 contract and expand in an inverse manner to the expansion and contraction of the capacitor body 110 in the Z direction by a poisson effect. Such contraction and expansion cause vibrations.

The vibrations may be transmitted to the substrate 401 through the first and second external electrodes 131 and 132 and the first and second external terminals 220 and 230, such that a sound is radiated from the substrate 410 to become acoustic noise.

In FIG. 8, reference numerals 421 and 422 represent first and second land patterns to which the first and second lower patterns 222 and 232 of the first and second external terminals 220 and 230 are in contact with each other, and reference numerals 310, 320, 431, and 432 represent conductive bonding agents.

Figure 9:
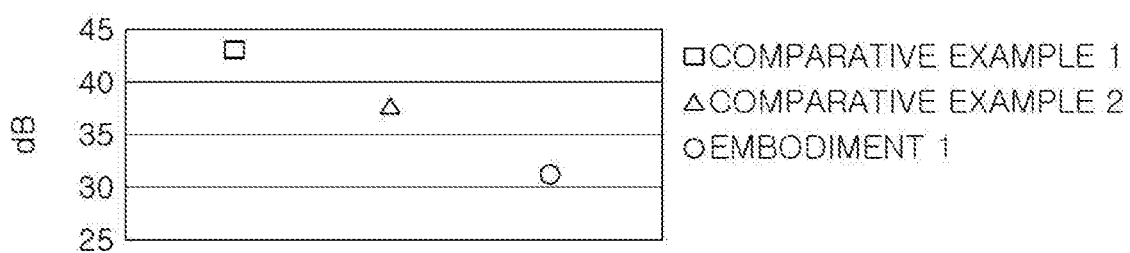
FIG. 9 is a graph comparing acoustic noise of the multilayer capacitor according to a presence or absence of the interposer and a structure of the upper pattern of the interposer.

FIG. 9 is a graph comparing the acoustic noise of the multilayer capacitor according to the presence or absence of the interposer and the structure of the upper pattern of the interposer.

In FIG. 9, Comparative Example 1 shows that a case in which the multilayer capacitor is directly mounted on the substrate without the interposer, and Comparative Example 2 shows that a case in which the upper pattern of the interposer is formed in a single layer structure, not in a two-layers structure, as the structure in the related art, and attached to the lower side of the multilayer capacitor and mounted on the substrate. As shown in FIG. 8, Embodiment 1 shows that a case in which the first and second upper patterns of the interposer 200 are formed in two-layer structure of the first and second shape-securing layers 221 and 231 and the first and second acoustic noise reduction layers 223 and 233 and are mounted on the substrate.

The interposer 200 of the present disclosure may be attached to a first surface, which is a mounting surface of the multilayer capacitor 100, to prevent vibrations of the multilayer capacitor 100 from being transmitted to the substrate 410, thereby reducing the acoustic noise of the multilayer capacitor 100.

Referring to FIG. 9, it can be seen that the acoustic noise occurs at about a level of 44 dB in Comparative Example 1.

In addition, it can be seen that the acoustic noise is reduced to about 37 dB and the acoustic noise is lowered by the interposer as compared to Comparative Example 1, in Comparative Example 2.

In Embodiment 1, it can be seen that the acoustic noise may be greatly reduced to about 31 dB as compared to Comparative Example 1 In which the upper pattern of a single layer having the same thickness is formed.

Meanwhile, in the present disclosure, the first and second acoustic noise reduction layers 223 and 233 may be formed such that X-Y axis area is same area as the area of the first and second shape-securing layers 221 and 231, respectively.

Figure 10:
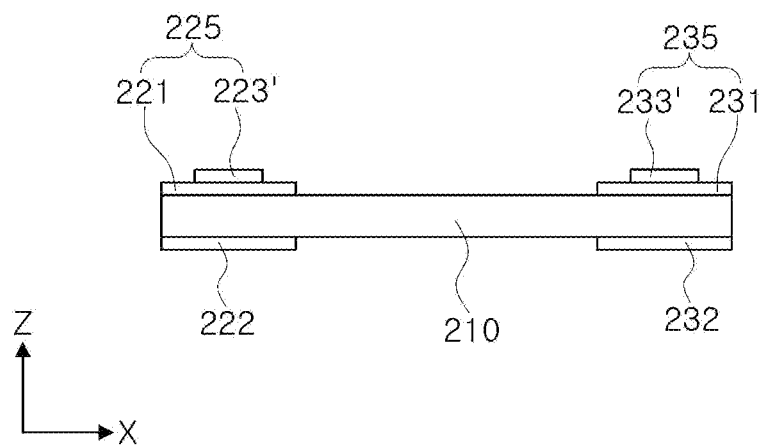
FIG. 10 is a front view of an interposer according to another embodiment of the present disclosure.
Figure 11:
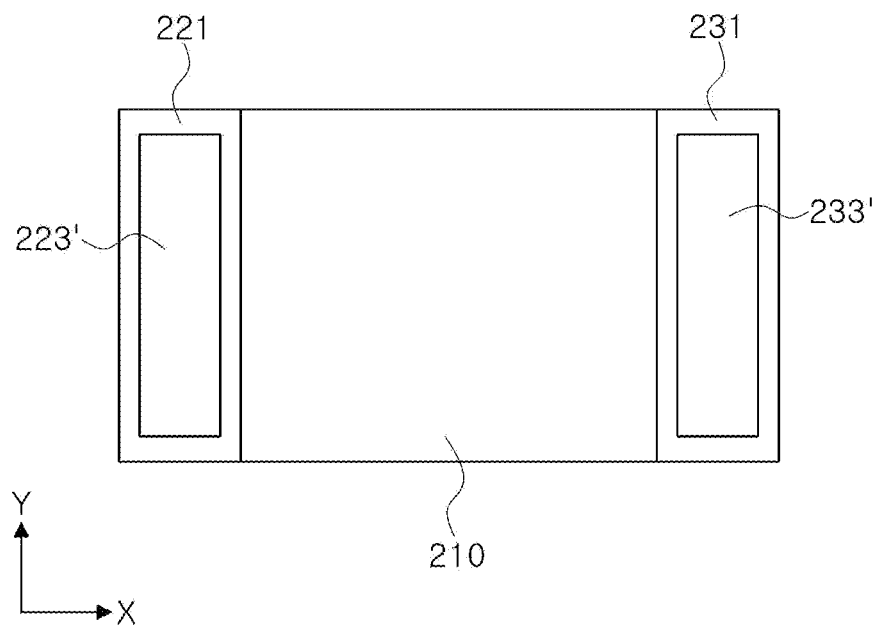
FIG. 11 is a plan view of FIG. 10.

As other embodiments, as illustrated in FIGS. 10 and 11, the first and second acoustic noise reduction layers 223' and 233' may be formed such that the X-Y axis area thereof is smaller than the area of the first and second shape-securing layers 221 and 231, respectively.

In this case, the first upper pattern 225 may have an area ratio of the first acoustic noise reduction layer 223' compared to the area of the first shape-securing layer 221 or an area ratio of the second acoustic noise reduction layer 233' compared to the area of the second shape-securing layer 231, may not exceed 81.43%.

If an area ratio of the first acoustic noise reduction layer 223' compared to an area of the first shape-securing layer 221 exceeds 81.43%, defects may occur in an appearance of the interposer.

If an area ratio of the second acoustic noise reduction layer 233' compared to an area of the second shape-securing layer 231 exceeds 81.43%, defects may occur in an appearance of the interposer.

Meanwhile, a plating layer may further be formed on surfaces of the first and second external terminals 220 and 230, if necessary.

The plating layer may include a nickel plating layer and a tin plating layer covering the nickel plating layer.

Figure 12:
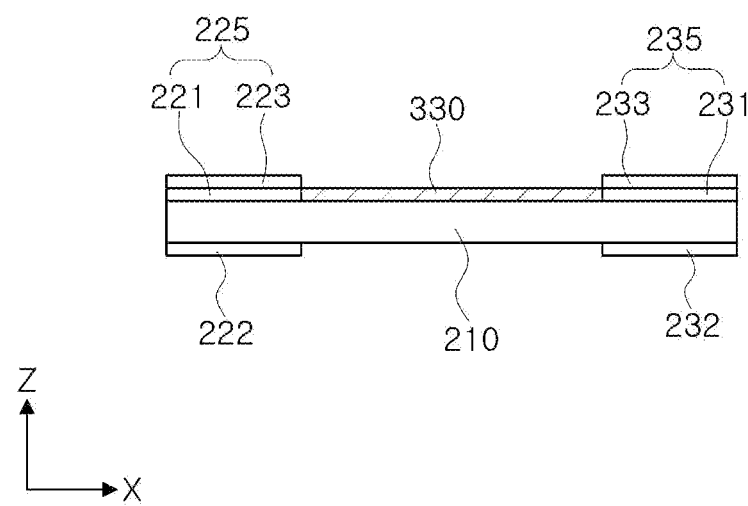
FIG. 12 is a front view illustrating that a marking portion is further included in the interposer according to an embodiment of the present disclosure.
Figure 13:
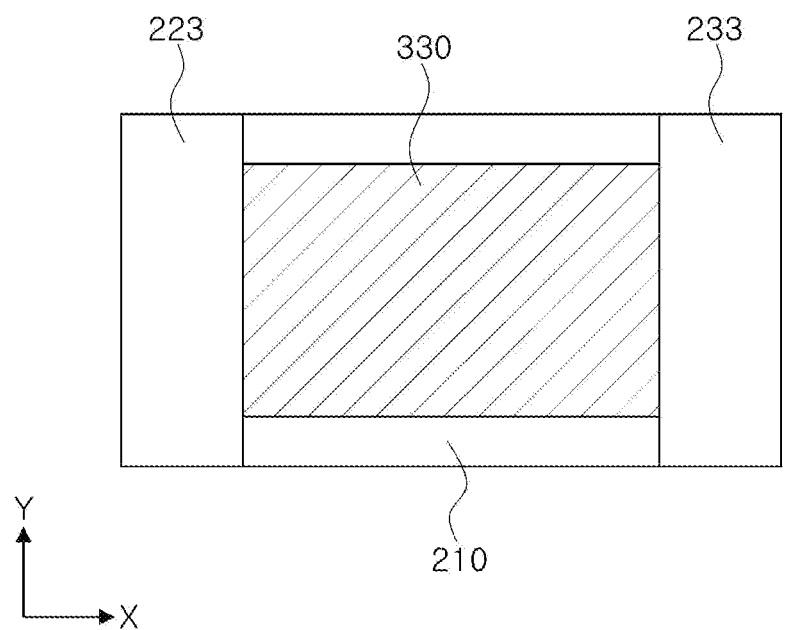
FIG. 13 is a plan view of FIG. 12.

As another embodiment, as shown in FIGS. 12 and 13, the interposer may further include a marking portion 330.

The marking portion 330 may be disposed between the first and second upper patterns 225 and 235 on the upper surface of the interposer body 210.

In this case, both ends of the marking portion 330 in the X direction may be in contact with first and second shape-securing layers 221 and 231 of the first and second upper patterns 225 and 235, respectively, and may be formed to be spaced apart from both sides fore-end of the interposer body 210 in the Y direction.

In addition, the marking portion 330 may be formed of an insulating material such as epoxy, or the like, and the present disclosure is not limited thereto.

The marking portion 330 may prevent a short between the first and second external terminals 220 and 230, and prevent foreign matters from being deposited on the upper surface of the interposer body 210. Further, the marking portion 330 may serve as marking capable of distinguishing upper and lower surfaces of the interposer body 210.

Table 1 below shows a change in defect rate of the interposer appearance depending on an area ratio of the shape-securing layer of the upper pattern and acoustic noise reduction layer in an X-Y-axis direction. In the present embodiment, 1000 products were tested for each of #1, #2, and #3, such that the defect ratio thereof was measured.

Here, the size of the interposer substrate is 1.18 mm and 1.66 mm in length and width, respectively.

TABLE 1

| # | Length/width/area of an acoustic noise reduction layer (mm) | Length/width/area of an acoustic noise reduction layer (mm) | Area of an acoustic noise reduction layer/Area of a shape-securing layer (%) | Defect rate of interposer appearance (%) |
|---|---|---|---|---|
| 1 | 1.080/0.390/0.421 | 0.980/0.370/0.363 | 85.23 | 1.5% |
| 2 | 1.100/0.320/0.352 | 1.000/0.300/0.300 | 85.23 | 1.0% |
| 3 | 1.080/0.390/0.421 | 0.980/0.350/0.343 | 81.43 | 0% |

Referring to Table 1, it can be seen that defects occur in an appearance of the interposer in the case of Samples 1 and 2, in which an area of an acoustic noise reduction layer exceeds 81.43% compared to an area of a shape-securing layer.

Meanwhile, a plating layer may further be formed on surfaces of the first and second external terminals 220 and 230, if necessary.

The plating layer may include a nickel plating layer and a tin plating layer covering the nickel plating layer.

In addition, after the plating layer is formed, a length of each of first and second upper patterns in the X direction may be set to 0.450 to 0.600 mm.

If the length of the first or second upper pattern in the X direction is less than 0.450 mm, electrical connection with external electrodes may be lowered, and if the length of the first or second upper pattern in the X direction exceeds 0.600 mm, the length of the upper pattern in the X direction is further increased when the plating process is performed on the upper pattern as described later, such that appearance defects may further be intensified.

As set forth above, according to an embodiment in the present disclosure, it is possible to prevent various defects that may occur during a surface mounting operation while maintaining the acoustic noise reduction effect of the multilayer capacitor at a certain level or more.

While exemplary embodiments have been shown and described above, it will be apparent to those skilled in the art that modifications and variations could be made without departing from the scope of the present invention, as defined by the appended claims.

What is claimed is:
1. An interposer comprising:
an interposer body;
first and second lower conductive patterns spaced apart from each other on a lower surface of the interposer body; and
first and second upper conductive patterns spaced apart from each other on an upper surface of the interposer body,
wherein the first and second upper conductive patterns comprise first and second conductive layers spaced apart from each other on the upper surface of the interposer body, and third and fourth conductive layers disposed on the first and second conductive layers, respectively, wherein the third and fourth conductive layers have thicknesses of 20 μm or less, respectively,
wherein a number of layers in one of the first and second lower conductive patterns is less than a number of layers in one of the first and second upper conductive patterns,
wherein areas of the third and fourth conductive layers are smaller than areas of the first and second conductive layers, respectively, and
wherein the first and second conductive layers and the third and fourth conductive layers include a same material.

2. The interposer of claim 1, wherein thicknesses of the first and second lower conductive patterns are 10 μm or less, respectively.

3. The interposer of claim 1, wherein the first and second conductive layers have thicknesses of 10 μm or less, respectively.

4. The interposer of claim 1, wherein an area ratio of the area of the third conductive layer compared to the area of the first conductive layer or an area ratio of the area of the fourth conductive layer compared to the area of the second conductive layer does not exceed 81.43%.

5. The interposer of claim 1, further comprising a marking portion disposed between the first and second upper conductive patterns on the upper surface of the interposer body.

6. The interposer of claim 1, further comprising:
a first conductive via penetrating the interposer body, and connecting the first lower conductive pattern and the first upper conductive pattern to each other; and
a second conductive via penetrating the interposer body, and connecting the second lower conductive pattern and the second upper conductive pattern to each other.

7. The interposer of claim 1, wherein the first upper conductive pattern is thicker than the first lower conductive pattern, and the second upper conductive pattern is thicker than the second lower conductive pattern.

8. The interposer of claim 1, wherein the first and second conductive layers are shape-securing layers, respectively, and the third and fourth conductive layers are acoustic noise reduction layers, respectively.

9. An interposer comprising:
an interposer body;
first and second lower conductive patterns spaced apart from each other on a lower surface of the interposer body;
first and second upper conductive patterns spaced apart from each other on an upper surface of the interposer body; and
a plating layer on surfaces of the first lower conductive pattern, the first upper conductive pattern, the second lower conductive pattern, and the second upper conductive pattern,
wherein the first and second upper conductive patterns comprise first and second conductive layers spaced apart from each other on the upper surface of the interposer body, and third and fourth conductive layers disposed on the first and second conductive layers, respectively,
wherein the third and fourth conductive layers have thicknesses of 20 μm or less, respectively, and
wherein a number of layers in one of the first and second lower conductive patterns is less than a number of layers in one of the first and second upper conductive patterns.

10. The interposer of claim 9, wherein a length of one of the first and second upper conductive patterns in a longitudinal direction of the interposer is 0.450 to 0.600 mm.

11. An electronic component comprising:
a multilayer capacitor including a capacitor body and first and second external electrodes respectively disposed on both ends of the capacitor body; and
an interposer including an interposer body and first and second external terminals respectively disposed on both ends of the interposer body,
wherein the first and second external terminals of the interposer comprise: first and second lower conductive patterns spaced apart from each other on a lower surface of the interposer body; and first and second upper conductive patterns spaced apart from each other on an upper surface of the interposer body, and connected to the first and second external electrodes, respectively,
wherein the first and second upper conductive patterns comprise first and second conductive layers spaced apart from each other on the upper surface of the interposer body, and third and fourth conductive layers disposed on the first and second conductive layers, respectively,
wherein areas of the third and fourth conductive layers are smaller than areas of the first and second conductive layers, respectively, and
wherein the electronic component further comprises:
a first conductive bonding agent disposed between the first upper conductive pattern and the first external electrode; and
a second conductive bonding agent disposed between the second upper conductive pattern and the second external electrode.

12. The electronic component of claim 11, wherein thicknesses of the first and second lower conductive patterns of the interposer are 10 μm or less, respectively.

13. The electronic component of claim 11, wherein the first and second conductive layers have thicknesses of 10 μm or less, respectively, and the third and fourth conductive layers have thicknesses of 20 μm or less, respectively.

14. The electronic component of claim 11, wherein an area ratio of the area of the third conductive layer compared to the area of the first conductive layer or an area ratio of the area of the fourth conductive layer compared to the area of the second conductive layer does not exceed 81.42%.

15. The electronic component of claim 11, further comprising a marking portion disposed between the first and second upper conductive patterns on the upper surface of the interposer body.

16. The electronic component of claim 11, wherein the capacitor body of the multilayer capacitor has first and second surfaces opposing each other, third and fourth surfaces connected to the first and second surfaces and opposing each other, and fifth and sixth surfaces connected to the first and second surfaces and the third and fourth surfaces and opposing each other, comprises a plurality of dielectric layers and a plurality of first and second internal electrodes disposed alternately with the dielectric layers interposed therebetween,
wherein one ends of the first and second internal electrodes connected to first and second external electrodes, respectively.

17. The electronic component of claim 16, wherein the first and second external electrodes comprise first and second head portions disposed on the third and fourth surfaces of the capacitor body, respectively; and first and second band portions extending from the first and second head portions to a portion of the first surface of the capacitor body.

18. The electronic component of claim 11, wherein the first and second conductive layers are shape-securing layers, respectively, and the third and fourth conductive layers are acoustic noise reduction layers, respectively.

19. The electronic component of claim 11, wherein the third and fourth conductive layers have thicknesses of 20 μm or less, respectively, and wherein a number of layers in one of the first and second lower conductive patterns is less than a number of layers in one of the first and second upper conductive patterns.

* * * * *